US012706574B2

(12) United States Patent
Babamir et al.

(10) Patent No.: US 12,706,574 B2
(45) Date of Patent: Aug. 11, 2026

(54) SYSTEMS FOR AND METHODS FOR WIDEBAND ISOLATED OUTPUTS

(71) Applicant: Avago Technologies International Sales Pte. Limited, Singapore (SG)

(72) Inventors: Seyed Mehrdad Babamir, San Diego, CA (US); Ali Afsahi, San Diego, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 302 days.

(21) Appl. No.: 18/498,773

(22) Filed: Oct. 31, 2023

(65) Prior Publication Data

US 2025/0141411 A1 May 1, 2025

(51) Int. Cl.
*H03F 3/19* (2006.01)
*H01P 5/16* (2006.01)

(52) U.S. Cl.
CPC ................ *H03F 3/19* (2013.01); *H01P 5/16* (2013.01); *H03F 2200/171* (2013.01); *H03F 2200/451* (2013.01)

(58) Field of Classification Search
CPC .... H03F 1/223; H03F 2200/451; H03F 3/195; H03F 3/193; H03F 2200/61; H03F 1/3205; H03F 2200/18; H03F 3/245; H03F 1/0205; H03F 2200/108; H03F 1/301; H03F 1/523
USPC ........................................................... 455/73
See application file for complete search history.

(56) References Cited

U.S. PATENT DOCUMENTS

2005/0248402 A1* 11/2005 Zhenbiao .............. H03F 1/0261 330/129
2014/0240048 A1* 8/2014 Youssef ................. H03F 3/245 330/296
2022/0393650 A1 12/2022 Ayranci et al.

OTHER PUBLICATIONS

Extended European Search Report on Appln. No. 24208115.6 dated Mar. 27, 2025.

* cited by examiner

*Primary Examiner* — Ajibola A Akinyemi
(74) *Attorney, Agent, or Firm* — Foley & Lardner LLP

(57) ABSTRACT

Wide-band output isolation is provided. A device includes a first output for a first radio frequency (RF) signal. A device includes a second output for a second RF signal. The device includes a first transistor having a first source/drain. The device includes a second transistor having a first source/drain, wherein the first source/drain of the first transistor is coupled to the first source/drain of the second transistor and wherein the first and second transistors are disposed between the first output and the second output.

22 Claims, 4 Drawing Sheets

SYSTEMS FOR AND METHODS FOR WIDEBAND ISOLATED OUTPUTS

FIELD OF THE DISCLOSURE

This disclosure generally relates to systems and methods for signal amplification and transmission. Particularly, the disclosure relates to an output circuit which may be employed with amplification circuits, such as radio frequency (RF) amplifiers.

BACKGROUND

In the last few decades, the market for wireless communications devices has grown by orders of magnitude, fueled by the use of portable devices, and increased connectivity and data transfer between all manners of devices. Digital switching techniques have facilitated the large-scale deployment of affordable, easy-to-use wireless communication networks. Furthermore, digital and radio frequency (RF) circuit fabrication improvements, as well as advances in circuit integration and other aspects have made wireless equipment smaller, cheaper, and more reliable. Wireless communication can operate in accordance with various standards such as IEEE 802.11x, Bluetooth, global system for mobile communications (GSM), and code division multiple access (CDMA). As higher data throughput, density of networks, and other changes develop, newer standards are constantly being developed for adoption. Many devices can include multi-device radios, antennae or other components. Such multi-mode devices can operate across various protocols, power levels, frequencies, and so forth.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
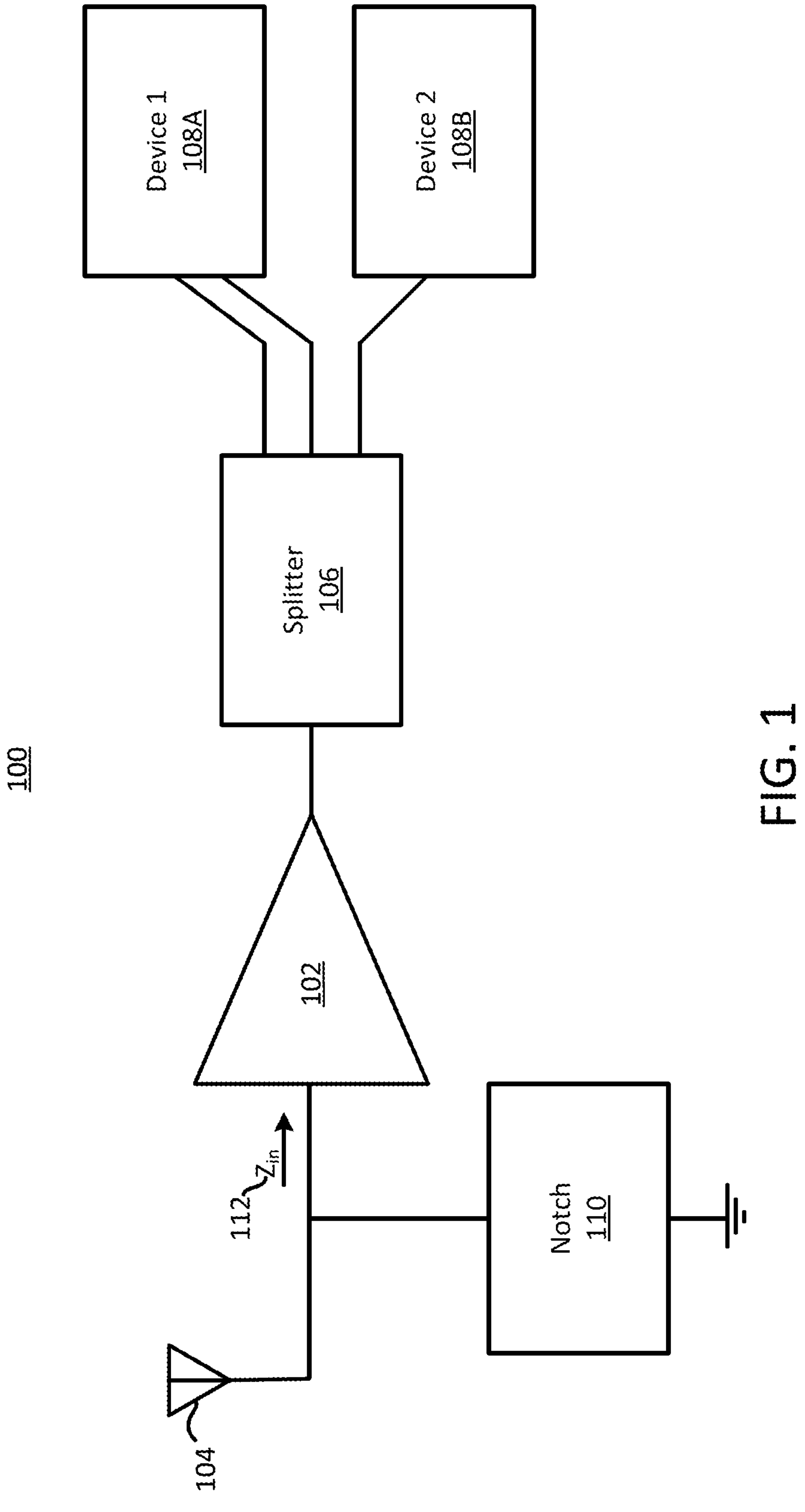
FIG. 1 is a schematic block diagram of a radio frequency amplification circuit, according to some embodiments.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Some embodiments disclosed herein are related to a device. The device can include a first output for a first radio frequency (RF) signal. The device can include a second output for second RF signal. The device can include a first transistor having a first source/drain. The device can include a second transistor having a first source/drain. The first source/drain of the first transistor can be coupled to the first source drain of the second transistor. The first and second transistors can be disposed between the first output and the second output.

In some embodiments, an input of the device is coupled to a gate of a third transistor. A first source/drain of the third transistor can be coupled with the first source/drain of the first transistor and the first source/drain of the second transistor. In some embodiments, the second source/drain of the first transistor is coupled with a first terminal of a first inductor. A second terminal of the first inductor can be coupled with a first voltage. The second source/drain of the second transistor can be coupled with a first terminal of a second inductor. The second terminal of the second inductor can be coupled with the first voltage.

In some embodiments, the first source/drain of the first transistor and the first source/drain of the second transistor is coupled with a first source/drain of a third transistor. A first gate of the first transistor can be coupled with a first voltage. A second gate of the second transistor can be coupled with a second voltage. The second source/drain of the third transistor can be coupled with a third voltage. In some embodiments, the first voltage differs from the second voltage and the third voltage. In some embodiments, the second voltage does not differ from the third voltage.

In some embodiments, the first output includes a first tee-filter configured to preferentially pass the first RF signal to a first connection terminal. The second output can include a second tee-filter configured to preferentially pass the second RF signal to a second connection terminal. In some embodiments, a first parameter of the first tee-filter varies from a second parameter of the second tee-filter. In some embodiments, a magnitude of an isolation between the first connection terminal and the second connection terminal is −20 dB or greater at a first center frequency of the first RF signal, and a second center frequency of the second RF signal.

In some embodiments, a first center frequency of the first RF signal varies from a second center frequency of the second RF signal by more than 1.5 GHz. In some embodiments, the first RF signal and the second RF signal are derived from a same antenna. In some embodiments, the first output and the second output are outputs of a power divider.

Some embodiments disclosed herein are related to a system. The system includes an amplifier. The amplifier can include a first output for a first radio frequency (RF) signal. The amplifier can include a second output for a second RF signal. The amplifier can include a cascode circuit. The cascode circuit can include a first source/drain of a first transistor coupled with the first output. The cascode circuit can include a first source/drain of a second transistor coupled with the second output. A first source/drain of a third transistor can be coupled with a second source/drain of the first transistor and a second source/drain of the second transistor.

In some embodiments, the first output includes a first tee-filter configured to preferentially pass the first RF signal to a first connection terminal. The second output can include a second tee-filter configured to preferentially pass the second RF signal to a second connection terminal. In some embodiments, a magnitude of an isolation between the first connection terminal and the second connection terminal is −20 dB or greater at a first center frequency of the first RF signal, and a second center frequency of the second RF signal. In some embodiments, the first RF signal and the second RF signal are derived from a same antenna. In some embodiments, a first center frequency of the first RF signal varies from a second center frequency of the second RF signal by more than 1.5 GHz. In some embodiments, the first output includes a first tee-filter configured to preferentially pass the first RF signal to a first connection terminal. The second output can include a second tee-filter configured to preferentially pass the second RF signal to a second connection terminal. A first parameter of the first tee-filter can vary from a second parameter of the second tee-filter.

Some embodiments disclosed herein are related to a method. The method includes receiving, at a gate of a first transistor, a first signal. The first signal can include first content centered about a first frequency. The first signal can include second content centered about a second frequency. The method can include receiving, at a first source/drain of a second transistor, the first content. The method can include receiving, at a first source/drain of a third transistor, the second content. The first content and the second content can include radio frequency content. The first frequency can exceed the second frequency by 1.5 GHZ.

In some embodiments, the method can include receiving, at a second gate of the second transistor and a third gate of the third transistor, a non-zero DC voltage.

An amplifier, such as a low noise amplifier for an RF circuit can supply one or more output signals to one or more devices via corresponding output ports for the amplifier. For example, an antenna can receive signals for any number of communication protocols (e.g., Wi-Fi, Cellular, Bluetooth, or so forth) and provide the aggregate signals to an amplifier for amplification. The amplifier can generate outputs corresponding with the various communication protocols, bands thereof, or other signals. The outputs of the amplifier can receive interference or other signals, such as via direct coupling from a device at the output, inductive coupling along a PCB trace, cabling, or other like. Further, some outputs can include different spectral content, relative to the other outputs. Achieving isolation between the various output ports can avoid mutual interference, increase a signal to noise ratio of the various output signals, or otherwise aid in the conveyance of the various output signals.

A cascode circuit at an output of an amplifier can include a common transistor to receive a signal derived from a source, such as an antenna. The cascode circuit can further include split second stage outputs (e.g., separate transistors for each output) such that a signal path joining the various outputs can extend across the channels of their respective output transistors. Thus, isolation (e.g., in isolation of −20 dB) can be achieved between the various outputs. The isolation may be aided by further elements separating the output ports. For example, a pull up network to VCC can include an inductive element to filter RF signals between the various outputs. Further, where the various output ports include different frequencies (e.g., do not overlap along at least a portion of operation), components of a filter for each output (or the inductive element of the pull up network) can be selected to selectively pass a signal of the output, relative to other outputs.

For clarity of the disclosure, before proceeding with further description of the systems and methods provided herein, illustrative descriptions of various terms are provided:

An output of a device may refer to or include a port (e.g., terminal) for an output signal generated by (e.g., transformed by) the device or a terminal to provide the output signal, in some embodiments. The output signal can include an amplified signal of an amplifier device. For example, a voltage or frequency can be amplified, relative to an input signal along at least a portion of a frequency spectrum. The terminal may refer to or include an element configured to couple the device to another device, to transfer a signal. For example, an electrical terminal can include a conductive element electrically coupled with a device connected to the output, such as a power divider connected to one or more further outputs. To continue the example, an output terminal for a radio frequency (RF) signal can be configured to pass signals at the radio frequency. A radio frequency (RF) signal may refer to or include a signal including one or more components in the RF range, which can extend from a kilohertz range to a GHz range (e.g., into the hundreds of GHz), in some embodiments. An RF signal may occupy bandwidth across a frequency range. A center frequency of a signal may refer to or include a spectral midpoint thereof, in some embodiments. For example, a signal extending from 2,427 MHz to 2,447 MHZ as associated with a center frequency of 2,437 MHZ.

Content of an RF signal may refer to or include encoded information, in some embodiments. The encoded information can include symbols which can be resolved to digitally encoded data according to a predefined mapping. The RF signal may be derived from an antenna. An antenna may refer to or include a device to receive electromagnetic waves, such as an RF signal, in some embodiments.

A power divider may refer to or include a device which receives an input signal and generates two or more output signals, in some embodiments. The output signals can be provided with a same or different power, frequency range, or other attributes. Power dividers can include, for example, Wilkinson dividers.

A non-zero direct current (DC) voltage may refer to or include a DC voltage that differs from one or more ground levels (e.g., power ground, signal ground, chassis ground, etc.), in some embodiments. Such a voltage may also be referred to as a bias voltage, and may be biased positively or negatively relative to the ground.

Isolation can refer to or include a degree to which output ports are decoupled from each other, in some embodiments. For example, the isolation can be quantized as a measure of a portion of one port that is measurable at another port. Greater isolation refers to ports that are more isolated (e.g., having a smaller magnitude of a signal measurable at another port), corresponding to a numerically smaller number. For example, two ports that are isolated at −30 dB exhibit greater isolation than two ports that are isolated at −20 dB.

A tee-filter may refer to or include a circuit having a series arm and a shunt arm, according to some embodiments. The series arm is generally depicted as a horizontal portion of a tee, and the shunt arm is generally depicted as the vertical portion of the tee. The series arm can include capacitors, inductors, or other filtering elements. The shunt arm can be connected along the series arm to connect to a voltage, such as ground or a bias voltage. A parameter of the tee-filter can refer to or include a characteristic impedance, propagation velocity, attenuation, phase shift, voltage standing wave ration (VSWR), capacitor, inductor, resistor value, or so forth, according to some embodiments. An inductor can refer to or include a component configured to store electrical energy in the form of a magnetic field when current flows through it, resisting changes in current, in some embodiments.

Preferential passage may refer to or include a signal passing across a filter or other element with lesser attenuation than at least some other signals, in some embodiments. For example, a filter can preferentially pass according to a magnitude, frequency, phase, etc. To continue with the example of frequency, a low pass filter can preferentially pass low frequency signals, a band pass filter can preferentially pass selected frequencies, and a high pass filter can preferentially pass high frequencies.

A cascode circuit may refer to or include an amplification circuit including at least two output stages, in some embodiments. For example, the first output stage can be common to two ports having an input at a gate, and a second stage can extend across a channel of a transistor coupled to a source/drain of the first output stage, the transistor biased according to a reference voltage. A source/drain of a transistor can refer to or include a terminal of a channel to receive or provide current, in some embodiments. A gate of a transistor may refer to or include a terminal to control a flow of current though a channel thereof, in some embodiments. The gate can correspond to various transistor types, and is not intended to limit a region of operation.

A voltage node may refer to or include a point on a circuit where two or more circuit elements are connected together in some embodiments. For example, a connection between a power plane (e.g., a ground plane) and a passive or active component or between two or more passive or active components may be referred to as a voltage node.

FIG. 1 depicts a schematic block diagram of a radio frequency amplification circuit 100, according to some embodiments. The circuit 100 can be configured to operate along various frequency bands. For example, the circuit 100 can operate across various bands of a wireless protocol such as a wireless fidelity (Wi-Fi) protocol, or across various wireless protocols such as Wi-Fi, Bluetooth, and so forth. The circuit 100 can include a low-noise amplifier 102 configured to receive a signal from an input port such as an antenna 104. The signal can include content distributed across one or more channels, such as channels exhibiting spectral diversity. For example, the antenna 104 can be a wideband antenna configured to receive various signals, such as Wi-Fi signals in a five or six GHz band (e.g., between 5.15-7.125 GHz), in a 2.4 GHz band (e.g., 2.4-2.5 GHZ), or other signals such as Bluetooth content (e.g., in a 2.4-2.49 GHz range), cellular telephone signals, or so forth.

The amplifier 102 can output a signal to one or more devices (or terminals configured to connect to further devices). For example, the amplifier 102 can couple to a splitter 106 to connect to multiple devices 108, or to convey multiple bands or signals to a single device 108. The difference in frequency of operation between the devices 108 can extend beyond other approaches, such as greater than 1.5 GHz, to operate with 5 GHz and 6 GHz Wi-Fi bands, or greater than 4 GHz, to operate with further 2.4 GHz bands of Wi-Fi or Bluetooth systems. The circuit 100 can be implemented on or include one or more silicon dies, multi-die packages, circuit boards, or the like.

The antenna 104 can receive various incidental signals or interference, such as wireless transmissions from radar systems, cordless phones, powerline interference (e.g., fifty or sixty Hz), and so forth. A filter (e.g., the depicted notch filter 110) can be configured to pass a band select frequency range corresponding to a bandwidth of the amplifier 102. The input impedance 112 into the amplifier 102 can vary over frequency, according to the frequency response of the notch filter 110. For a frequency of interest, the notch filter can be adjusted to increase an input impedance. However, the adjustments may be targeted to a center frequency of operation, wherein the wideband operation can exceed a rejection band of the notch filter 110. The splitter 106 (e.g., power divider) can include inter-output isolation between the wideband outputs.

Figure 2:
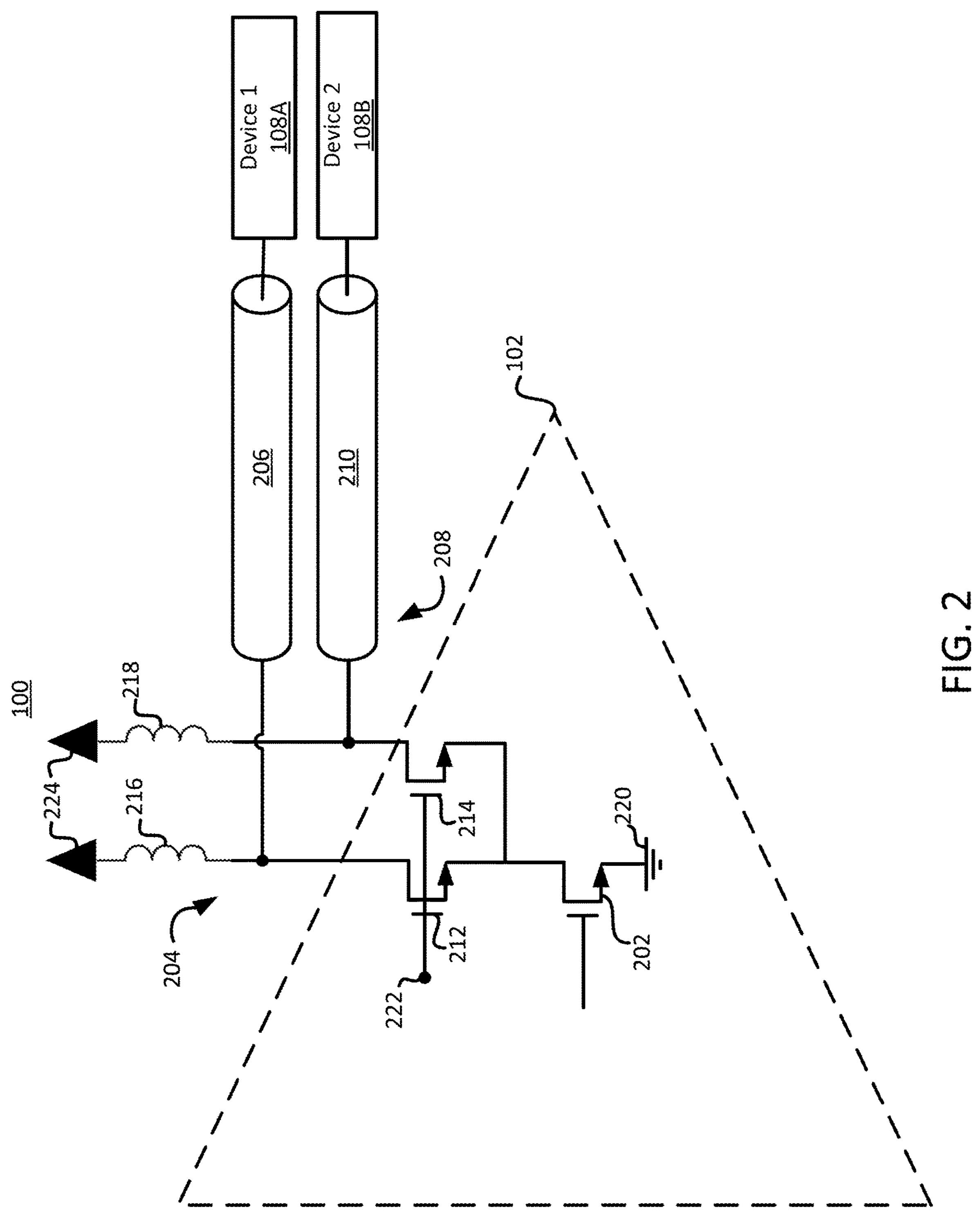
FIG. 2 is another schematic block diagram of a radio frequency amplification circuit, according to some embodiments.

Referring now to FIG. 2, another schematic block diagram of a radio frequency amplification circuit 100 is provided, according to some embodiments. The schematic block diagram is provided as a functional schematic, and does not necessarily correlate to a physical placement of any particular component. Further, although particular components are referred to as constituent to the amplifier, or an output associated therewith, such categorizations are merely descriptive according to the depictions provided herein. For example, although a dotted line is provided as a boundary for the amplifier 102, such a depiction is not limiting. The circuit portions exterior to the boundary line can be referred to as outputs of the amplifier 102, outputs for the amplifier 102, or as another component, such as the splitter 106 (e.g., RF power divider) of FIG. 1. For example, in some instances, the depicted circuit 100 may be referred to as an amplifier 102. As depicted, the amplifier 102 can include a common transistor 202, depicted as a first stage of one or more cascode circuits. A first source/drain of the common transistor 202 is connected to a reference voltage 220, depicted as a ground. In various embodiments, the reference voltage 220 can include various other voltage levels, such as to bias the circuit 100 output upward or downward. A second source/drain of the common transistor connects to any number of outputs of the circuit 100. For example, the depicted circuit includes two outputs.

The cascode circuit includes the common transistor 202 along with any number of other transistors of a split second stage. The common transistor 202 receives an input signal at a gate thereof, and provides an amplified output signal to a first source/drain of any number of cascode devices of a second stage of the cascode circuit. The common transistor 202 can amplify more or less than the second stage (e.g., one of the first or second stages may be a unity gain for one or more outputs). The various cascode devices of the second stage can include a feedback network (not depicted) at one terminal and to a voltage node including the second source/drain of an associated transistor 212, 214, a terminal of a pull-up network (e.g., inductor 216, 218 thereof) associated with the output, and portion of a transmission line filter associated with the output.

The depicted circuit 100 includes cascode devices including a first transistor 212 corresponding to a first output and a second transistor 214 corresponding to a second output. A first source/drain of the first transistor 212 and second transistors 214 are connected to each other at the second source/drain of the common transistor 202. The first output and second output, depicted as extending to or through a first transmission line 206 and second transmission line 210 (e.g., a distal or proximal end thereof), can connect to one or more devices, or be configured to preferentially pass some signals relative to others. For example, the outputs 206, 210 can be configured to pass signals having different frequencies, power levels, magnitudes, or other attributes according to a filter thereof. The gates of the first transistor 212 and second transistor 214 can be coupled to a varying or, as depicted, same biasing voltage 222 to control an output thereof, at respective second source/drains. Further, a voltage node of the biasing voltage 222 can be a VCC or reference voltage 220, or another voltage.

The respective outputs can connect to one or more devices 108 (e.g., a first device 108A and second device 108B, as depicted). The devices 108 can be coupled to the depicted circuit 100 by a terminal (e.g., pin, ball, bump, pillar, etc.) of a semiconductor device, printed circuit board connection, or on-chip connection. For example, the connection can be in a metallization layer formed over an active surface of a semiconductor die, the active surface including n-wells or p-wells for the depicted transistors, or otherwise including one or more of the depicted circuit 100 components.

The first output is provided between the amplifier 102 and a first device 108A. The first output extends from the second source/drain of the common transistor 202 to the first transmission line 206. The first output includes the first transistor 212 connected to a first voltage 224 (e.g., VCC), through a pull up network including an inductive element 216 (e.g., an RF choke). A power plane for the first voltage may provide RF isolation by damping any RF signals (e.g., to improve isolation between the first output and the second output).

A second output 208 is provided between the amplifier 102 and a second device 108B. The second output extends from the second source/drain of the common transistor 202 to the second transmission line 210. The second output 208 includes the second transistor 214 connected to a voltage, which may be a same voltage as the first voltage 224 (e.g., VCC), or can vary therefrom.

In various embodiments, the circuit can include a third, fourth, fifth, or further outputs provided in parallel to the depicted outputs. For example, the further outputs can include further second stage transistors of further cascode circuits coupled to the second source/drain of the common transistor 202, pull up networks, gate biases, etc. The further (or depicted) outputs can include components that are the same between the various outputs, or that vary according to a power level, frequency, output device, etc. For example, outputs can include various bias voltages according to a desired power level of an output, pull up networks according to a desired isolation or frequency response, various cascode device sizes, or different transmission lines 206, 210 according to a desired frequency band associated with a signal. The various outputs may be configured to operate with signals having different frequencies (e.g., center frequencies, such as in the case of a combination of one or more Wi-Fi, Bluetooth, cellular or other protocols). Some frequencies can include various channels of communication protocols varying between 900 MHz, 2.4 GHZ, 5 GHZ, 6 GHZ, etc. That is, the center frequency of the various signals can vary by more than 1 GHz, such as 1.5 GHZ, 2 GHZ, 4 GHZ, or so forth. Moreover, the various outputs can couple to further devices, wherein the further devices can couple various signals (e.g., interfering signals) into the outputs such that isolating the outputs can improve a bit rate error, throughput, or other characteristic of the circuit 100, or a network including the circuit 100. For example, the various outputs can connect, via cables, conductive traces, or other connectors, which may directly or inductively couple into the outputs (e.g., along the signal conductors, shields, etc.).

Figure 3:
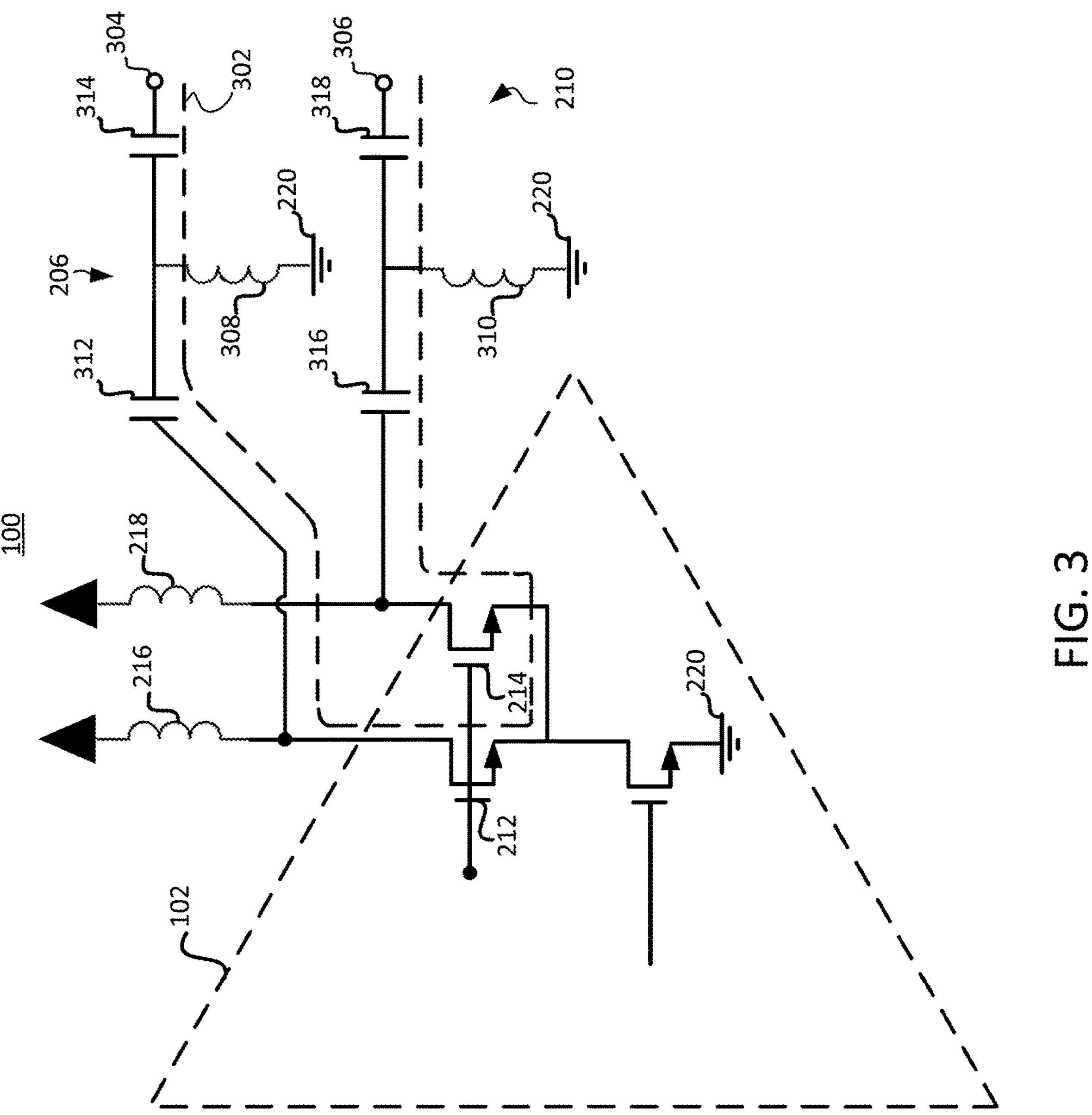
FIG. 3 is a schematic block diagram of a radio frequency amplification circuit, depicting an inter-port signal path associated therewith, according to some embodiments.

FIG. 3 is yet another schematic block diagram of a radio frequency amplification circuit 100, according to some embodiments. The schematic block diagram includes a signal path 302 between a first terminal 304 of the first output and a second terminal 306 of the second output. The signal path 302 is provided as a non-directional path. According to various embodiments, the isolation of a path may be directional, such that an isolation from the first output to the second output, sometimes referred to as a S23 transmission coefficient (corresponding to second and third ports of the circuit) differs from isolation from the second output to the first output (e.g., an S32 transmission coefficient).

Signal paths can vary according to component values associated with an output, a frequency of a signal associated with an output, etc. The depicted signal path 302 is not intended to depict a sole signal path. For example, further signal paths can extend through feedback networks, power planes (e.g., through the respective pull up networks, inductive elements 216, 218 thereof, or so forth). However, according to some component values, or noise suppression of power or ground planes, the depicted signal path 302 can constitute a substantial portion (e.g., majority) of the isolation between the output channels, particularly for frequencies in the GHz range.

Further, in order to depict the propagation of the signal path 302 through the circuit 100, some example transmission line components are depicted. Particularly, the first transmission line 206 and second transmission line 210 are depicted to include tee-filters including a respective shunt arm to a reference voltage 220 that may be common or different between transmission lines of the various outputs. For example, as depicted, the reference voltage 220 can be a ground, which is shared with the reference voltage 220 of the first source/drain of the common transistor 202. The shunt arms include respective inductive elements 308, 310. A terminal of the respective inductive elements 308, 310 opposite from the reference voltage 220, connects to connected terminals of series capacitors of the transmission line 206, 210. For example, an inductive element 308 of the first output can connect to a proximal capacitor 312 and distal capacitor 314, relative to the amplifier 102. An inductive element 310 of the second output can connect to a proximal capacitor 314 and distal capacitor 318, relative to the amplifier 102.

Although, as described above, the signal path 302 is provided without directionality, the signal can be described starting with the first terminal 304, merely for ease of description. The signal path 302 extends across the first transmission line 206 (e.g., the series arm of the tee-filter thereof). The signal path 302 extends across a channel of the first transistor 212 to a node including the first source/drain of the second stage cascode transistors (e.g., the first transistor 212 and second transistor 214). The signal path 302 extends across a channel of the second transistor 214 to the second transmission line 210, and across the series arms thereof (e.g., the capacitors 316, 318).

The passage across multiple transistor channels can substantially limit a flow of any incidental portion between the outputs, such that the S23 or S32 isolation can substantially isolate the outputs. For example, the isolation can exceed-20 dB (e.g., according to the depicted signal path 302 in combination with any further signal paths). For example, isolation between a center frequency of the respective output signals associated with the first terminal 304 and second terminal 306 can exceed-20 dB. The tee-filters can selectively pass a signal according to a resonant frequency.

$$f = \frac{1}{2\pi\sqrt{LC}}$$

For example, for a resonant frequency of 6 GHz (e.g., corresponding to a 5-7 GHz band), the capacitors of the first output can be on the order of 1 pF, and the inductor can be about 7 nH. Of course, such a value is a first order approximation of a circuit performance, which will vary according to a geometry, input impedances (e.g., into the first transistor 212, second transistor 214, first device 108A, second device 108B, etc.), any parasitic, resistances, and so forth, which may readily be determined according to various RF simulation techniques.

The tee-filters (or other transmission line networks employed in various embodiments) can thus be configured to selectively pass an RF signal associated therewith, which may further aid in isolation, both by limiting attenuation of a desired signal, and increasing attenuation of other (e.g., aggressor) signals across the transmission line. For example, any parameter of the tee-filter or other transmission line can vary from any other transmission line. For example, selected component values, circuit geometries, or other variances can be configured to effect such parameters.

The circuit 100 can isolate signals, such as signals derived from a same antenna, such that the separate signals can be provided to different ports (e.g., output ports, relative to the amplifier 102) with isolation therebetween. That is, the circuit 100 can be or include a power divider configured to divide a signal received from an antenna 104 into various constituent signals, each constituent signal configured for provision to a separate amplifier output, which may be connected to any number of devices.

Figure 4:
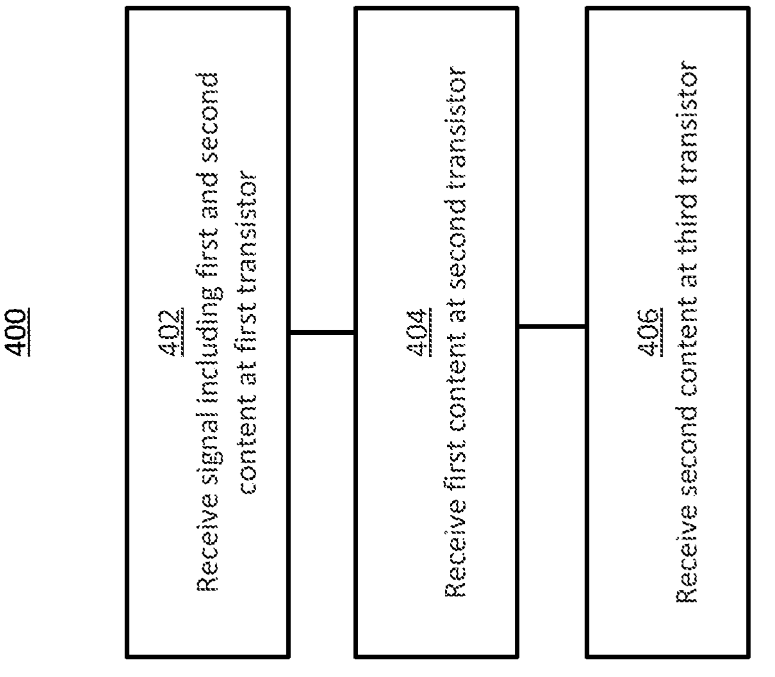
FIG. 4 is a flow diagram showing operations for a method, according to some embodiments.

FIG. 4 is a flow diagram showing operations for a method 400 of circuit operation, according to some embodiments. At operation 402, a signal is received at a transistor (e.g., the common transistor 202 of FIG. 2 and FIG. 3). The signal can include any number of constituent signals, such as signals of various frequencies, protocols, durations, and the like. A portion of the constituent signals can overlap in frequency or duration, such as in the case of 2.4 GHz Wi-Fi and Bluetooth messages, Wi-Fi messages of overlapping basic service sets, or so forth. The signals can be received from an antenna and passed through any number of filters, splitters, rectifiers, or other circuitry. A portion of the constituent signals can include content such as symbols mapped to digital information. For example, the received signal can include first content centered about a first frequency (e.g., a first center frequency). The received signal can include second content centered about a second frequency (e.g., a second center frequency).

At operation 404, first content is received at another transistor (e.g., at a source/drain thereof). For example, the signal can propagate from a gate of a common transistor 202 to amplify a magnitude thereof as output at a source/drain of the common transistor 202. The output can connect to a source/drain of the transistor (e.g., a first transistor 212 of a first output). The first content can be received along with other content, such as second content, third content, or so forth, which can include signals associated with a device connected to the output, interference, or other signals. The transistor (e.g., the first transistor 212) can pass the first content across a channel thereof, based on a non-zero DC voltage received at a gate, for provision to a first device (e.g., across a first tee-filter corresponding to the first content).

At operation 406, second content is received at another transistor still (e.g., at a source/drain thereof). For example, the transistors of operation 404 and operation 406 can be a split second stage of a cascode circuit, along with any number of further transistors. A center frequency of the second content can vary by more than 1.5 GHZ, 2 GHz, 4 GHZ, or another value, relative to the center frequency of the first content. The second content can include information encoded according to a same or different protocol, relative to the first content. The transistor (e.g., the second transistor 214) can pass the second content across a channel thereof, based on a non-zero DC voltage received at a gate, which may be the same or different from a voltage received at the gate of the transistor of operation 404, for provision to a second device (e.g., across a second tee-filter corresponding to the second content). For example, the first and second tee-filters can vary according to a parameter thereof.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., reader elements, writer elements, or magnetic media) that can operate within a system or environment. It should be understood that the systems described above can provide multiple ones of any or each of those components and these components can be provided on either a standalone machine or, in some embodiments, on multiple machines in a distributed system. Further still, bit field positions can be changed, and multibit words can be used. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical (e.g., magnetic), or fluidic.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A device comprising:

a first output for a first radio frequency (RF) signal;

a second output for a second RF signal;

a first transistor having a first source/drain; and a second transistor having a first source/drain, wherein the first source/drain of the first transistor is coupled to the first source/drain of the second transistor and wherein the first and second transistors are disposed between the first output and the second output, wherein:

the first output comprises a first tee-filter configured to preferentially pass the first RF signal to a first connection terminal; and the second output comprises a second tee-filter configured to preferentially pass the second RF signal to a second connection terminal.

2. The device of claim 1, comprising an input coupled to:

a gate of a third transistor, a first source/drain of the third transistor coupled with the first source/drain of the first transistor and the first source/drain of the second transistor.

3. The device of claim 1, wherein:

the second source/drain of the first transistor is coupled with a first terminal of a first inductor, a second terminal of the first inductor coupled with a first voltage node; and the second source/drain of the second transistor is coupled with a first terminal of a second inductor, the second terminal of the second inductor coupled with the first voltage node.

4. The device of claim 1, wherein:

the first source/drain of the first transistor and the first source/drain of the second transistor is coupled with a first source/drain of a third transistor;

a first gate of the first transistor is coupled with a first voltage node;

a second gate of the second transistor is coupled with a second voltage node; and the second source/drain of the third transistor is coupled with a third voltage node.

5. The device of claim 4, wherein:

a voltage of the first voltage node differs from a voltage of the second voltage node and a voltage of the third voltage node.

6. The device of claim 4, wherein:

a voltage of the second voltage node does not differ from a voltage of the third voltage node.

7. The device of claim 1, wherein a first parameter of the first tee-filter varies from a second parameter of the second tee-filter.

8. The device of claim 1, wherein:

a magnitude of an isolation between the first connection terminal and the second connection terminal is −20 dB or greater at:

a first center frequency of the first RF signal; and a second center frequency of the second RF signal.

9. The device of claim 1, wherein:

a first center frequency of the first RF signal varies from a second center frequency of the second RF signal by more than 1.5 GHz.

10. The device of claim 1, wherein:

the first RF signal and the second RF signal are derived from a same antenna.

11. The device of claim 1, wherein:

the first output and the second output are outputs of a power divider.

12. A system, comprising:

an amplifier comprising:

a first output for a first radio frequency (RF) signal; and a second output for a second RF signal; and a cascode circuit comprising:

a first source/drain of a first transistor coupled with the first output;

a first source/drain of a second transistor coupled with the second output; and a first source/drain of a third transistor coupled with a second source/drain of the first transistor and a second source/drain of the second transistor, wherein:

a magnitude of an isolation between a first connection terminal of a first filter configured to preferentially pass the first RF signal and a second filter configured to preferentially pass the second RF signal, is −20 dB or greater at:

a first center frequency of the first RF signal; and a second center frequency of the second RF signal.

13. The system of claim 12, wherein:

the first filter comprises a first tee-filter configured to preferentially pass the first RF signal to the first connection terminal; and the second filter comprises a second tee-filter configured to preferentially pass the second RF signal to the second connection terminal.

14. The system of claim 12, wherein the first RF signal and the second RF signal are derived from a same antenna.

15. The system of claim 12, wherein a first center frequency of the first RF signal varies from a second center frequency of the second RF signal by more than 1.5 GHZ.

16. The system of claim 12, wherein:

the first output comprises a first tee-filter configured to preferentially pass the first RF signal to a first connection terminal; and the second output comprises a second tee-filter configured to preferentially pass the second RF signal to a second connection terminal, wherein:

a first parameter of the first tee-filter varies from a second parameter of the second tee-filter.

17. A method comprising:

receiving, at a gate of a first transistor, a first signal comprising:

first content centered about a first frequency; and second content centered about a second frequency;

receiving, at a first source/drain of a second transistor, the first content;

receiving, at a first source/drain of a third transistor, the second content, wherein:

the first source/drain of the first transistor is coupled to the first source/drain of the second transistor and wherein the first and second transistors are disposed between a first output and a second output;

the first content and the second content comprise radio frequency content; and the first frequency exceeds the second frequency by 1.5 GHz.

18. The method of claim 17, comprising:

receiving, at a second gate of the second transistor and a third gate of the third transistor, a non-zero DC voltage.

19. A device comprising:

a first output for a first radio frequency (RF) signal;

a second output for a second RF signal;

a first transistor having a first source/drain;

a second transistor having a first source/drain, wherein the first source/drain of the first transistor is coupled to the first source/drain of the second transistor and wherein the first and second transistors are disposed between the first output and the second output; and a first center frequency of the first RF signal varies from a second center frequency of the second RF signal by more than 1.5 GHz.

20. A system, comprising:

an amplifier comprising:

a first output for a first radio frequency (RF) signal; and a second output for a second RF signal; and a cascode circuit comprising:

a first source/drain of a first transistor coupled with the first output;

a first source/drain of a second transistor coupled with the second output; and a first source/drain of a third transistor coupled with a second source/drain of the first transistor and a second source/drain of the second transistor, wherein:

the first output comprises a first tee-filter configured to preferentially pass the first RF signal to a first connection terminal; and the second output comprises a second tee-filter configured to preferentially pass the second RF signal to a second connection terminal.

21. A system, comprising:

an amplifier comprising:

a first output for a first radio frequency (RF) signal; and a second output for a second RF signal; and a cascode circuit comprising:

a first source/drain of a first transistor coupled with the first output;

a first source/drain of a second transistor coupled with the second output; and a first source/drain of a third transistor coupled with a second source/drain of the first transistor and a second source/drain of the second transistor, wherein:

a first center frequency of the first RF signal varies from a second center frequency of the second RF signal by more than 1.5 GHz.

22. A system, comprising:

an amplifier comprising:

a first output for a first radio frequency (RF) signal; and a second output for a second RF signal; and a cascode circuit comprising:

a first source/drain of a first transistor coupled with the first output;

a first source/drain of a second transistor coupled with the second output; and a first source/drain of a third transistor coupled with a second source/drain of the first transistor and a second source/drain of the second transistor, wherein:

the first output comprises a first tee-filter configured to preferentially pass the first RF signal to a first connection terminal;

the second output comprises a second tee-filter configured to preferentially pass the second RF signal to a second connection terminal; and a first parameter of the first tee-filter varies from a second parameter of the second tee-filter.

* * * * *